(12) United States Patent
Ma et al.

(10) Patent No.: US 6,277,665 B1
(45) Date of Patent: Aug. 21, 2001

(54) FABRICATION PROCESS OF SEMICONDUCTOR LIGHT-EMITTING DEVICE WITH ENHANCED EXTERNAL QUANTUM EFFICIENCY

(75) Inventors: Shao-Kun Ma; Han-Tsung Lai, both of Hsinchu (TW)

(73) Assignee: United Epitaxy Company, Ltd. (TW)

( * ) Notice: Subject to any disclaimer, the term of this patent is extended or adjusted under 35 U.S.C. 154(b) by 0 days.

(21) Appl. No.: 09/480,068

(22) Filed: Jan. 10, 2000

(51) Int. Cl.[7] .................................................. H01L 21/00
(52) U.S. Cl. ................................. 438/46; 257/98
(58) Field of Search .................. 438/46, 287, 312, 438/328; 257/98, 102, 103, 104, 106, 109, 199

(56) References Cited

U.S. PATENT DOCUMENTS

| | | | |
|---|---|---|---|
| 5,040,044 | 8/1991 | Noguchi et al. | 357/52 |
| 5,429,954 | 7/1995 | Gerner | 437/23 |
| 5,779,924 * | 7/1998 | Krames et al. | 216/24 |
| 5,792,698 * | 8/1998 | Nishitani | 438/287 |
| 5,898,192 * | 4/1999 | Gerner | 257/98 |

\* cited by examiner

*Primary Examiner*—David Nelms
*Assistant Examiner*—Quoc Hoang
(74) *Attorney, Agent, or Firm*—Coudert Brothers

(57) ABSTRACT

A method of fabricating a semiconductor light-emitting device is provided in the present invention. The semiconductor light-emitting device includes a light-emitting region such as a PN-junction, or a double heterojunction, or a multiple quantum well. According to the invention, an layer consisting of an electrode material is formed overlaying a top-most layer of the semiconductor light-emitting device. Afterwards, an annealing process is performed to the resultant structure so that the electrode material diffuses into the top-most layer. Subsequently, the layer consisting of the electrode material is etched partially to formed an upper electrode on the top-most layer and to expose part of the top-most layer. Substantially, the exposed part of the top-most layer exhibits a rough morphology. Thereby, the external quantum efficiency of the semiconductor light-emitting device is enhanced. The method can be implemented regardless of material and lattice orientation of the top-most layer.

17 Claims, 4 Drawing Sheets

FABRICATION PROCESS OF SEMICONDUCTOR LIGHT-EMITTING DEVICE WITH ENHANCED EXTERNAL QUANTUM EFFICIENCY

FIELD OF THE INVENTION

The present invention relates to fabrication process of a semiconductor light-emitting device, such as a light-emitting diode (LED), whose external quantum efficiency is increased by using a surface roughening method.

BACKGROUND OF THE INVENTION

Nowadays, semiconductor light-emitting devices, such as light-emitting diodes, have been used for a wide variety of applications, e.g., illumination and remote control. To ensure high functional reliability and a low power requirement of the semiconductor light-emitting devices, as great as possible, the external quantum efficiency is required from the devices.

In principle, the external quantum efficiency of a semiconductor light-emitting device is determined both by the internal quantum efficiency and extraction efficiency. The internal quantum efficiency is determined by the material property and quality. The extraction efficiency means the proportion of radiation emitted from the interior of the device into surrounding air or encapsulating epoxy. The extraction efficiency is determined by the losses occurring when radiation leaves the interior of the device. One of the main causes for such losses is the radiation proportion resulting from the high optical refraction coefficient of the semiconductor material, e.g., about 3.6 for gallium arsenide (GaAs), that cannot be emitted at the semiconductor surface on account of total reflection. In the case of GaAs, a critical angle for the total reflection of 16.2° results at the transition to air. By the direct path, only the proportion of radiation that hits the boundary surface below a lower angle to the surface normal is emitted. However, this radiation proportion is still subject to a partial reflection caused by the abrupt change in the refraction coefficient. For radiation hitting the boundary surface vertically, the transmission coefficient is about 68%, so that if the absorption of the radiation on the way to the boundary surface is ignored, only about 2.7% of the generated radiation can leave the semiconductor crystal on a direct path in the case of a flat structure.

Some prior arts regarding the fabrication of semiconductor light-emitting devices disclose the way for enhancing the external quantum efficiency of the semiconductor light-emitting devices by using surface roughening method, and are listed as follows: U.S. Pat. Nos. 5,898,192; 5,429,954; and 5,040,044.

However, the foregoing prior arts still indicate the need for a new surface roughening method applicable to any kind of semiconductor light-emitting devices. Specially for a top-most layer formed of (100)-oriented GaP, it usually serves as a window layer of a semiconductor light-emitting device having an active layer of AlGaInP, and its surface is still difficult to be roughened uniformly so far. Therefore, it is desired that the new surface roughening method can be performed to a top-most layer (covering layer) of a semiconductor light-emitting device, which is formed of a customary semiconductor material such as GaP, GaAsP and AlGaAs. Moreover, the top-most layer can be roughened by using the method regardless of lattice orientation of the semiconductor material made into the top-most layer. It is also desirable that a surface-roughened top-most layer of a semiconductor light-emitting device, made by use of the surface roughening method, has an uniform surface roughness. It is also desirable that the surface roughening method is a reproducible and low-cost procedure. The present invention is directed toward satisfying the aforesaid need.

SUMMARY OF THE INVENTION

It is an objective of the invention to provide a method of fabricating a semiconductor light-emitting device whose external quantum efficiency is increased by roughening an upper surface of the semiconductor light-emitting device.

It is another objective of the invention to provide a surface roughening method applicable to any kind of semiconductor light-emitting devices, i.e., the surface roughening method can be implemented regardless of lattice orientation and material of a target layer (top-most layer).

It is another objective of the invention to provide a method for roughening a surface of a top-most layer of a semiconductor light-emitting device whereby the roughened surface has an uniform surface roughness.

It is another objective of the invention to provide a method for roughening a surface of a top-most layer of a semiconductor light-emitting device. Moreover, the method is a reproducible and low-cost procedure.

According to the invention, a method of fabricating a semiconductor light-emitting device is provided. First, a multi-layer structure including a light-emitting region, such as a PN-junction, or a double hetero-junction, or a multiple quantum well, is formed on a semiconductor substrate. Afterwards, a top-most layer is formed and overlays the multi-layer structure. A layer consisting of an electrode material overlaying the top-most layer is then formed. The resultant structure is then performed an annealing process such that the electrode material diffuses into the top-most layer. Subsequently, the layer consisting of the electrode material is etched partially to formed an upper electrode on the top-most layer and to expose part of the top-most layer. Substantially, the part of the top-most layer, exposed, has a rough surface. The method can be implemented regardless of material and lattice orientation of the top-most layer, and provide the top-most layer with an uniform surface roughness.

The advantage and spirit of the invention may be understood by the following recitations together with the appended drawings.

BRIEF DESCRIPTION OF THE APPENDED DRAWINGS

DETAILED DESCRIPTION OF THE INVENTION

The present invention is to provide a method of a semiconductor light-emitting device with enhanced external quantum efficiency due to roughened surface thereof. Referring to FIGS. 1A through 1E, they are schematic sectional views illustrating a method according to the invention. The method will be described in details as follows.

Figure 1A:
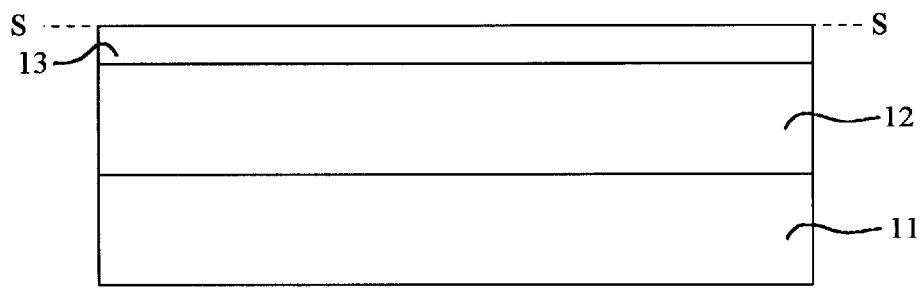
FIGS. 1A through 1E are schematic sectional views illustrating a method of fabricating a semiconductor light-emitting device in accordance with the invention.

First, a multi-layer structure 12, consisting of a plurality of epitaxial layers formed in sequence, is formed on a semiconductor substrate 11. In particular, the multi-layer structure 12 includes a light-emitting region such as a PN-junction, or a double hetero-junction, or a multiple quantum well. Thereafter, a top-most layer 13 is formed and overlays the multi-layer structure 13, as shown in FIG. 1A. The dashed line S—S denotes a upper surface of the top-most layer 13. In one embodiment, the top-most layer 13 maybe serve as a covering layer, or an ohmic contact layer, or a window layer in accordance with the design of the semiconductor light-emitting device. In one embodiment, the top-most layer 12 may be formed of a material selected from the group consisting of GaP, GaAsP, AlGaAsP, and the like for matching with the multi-layer structure 11.

Figure 1B:
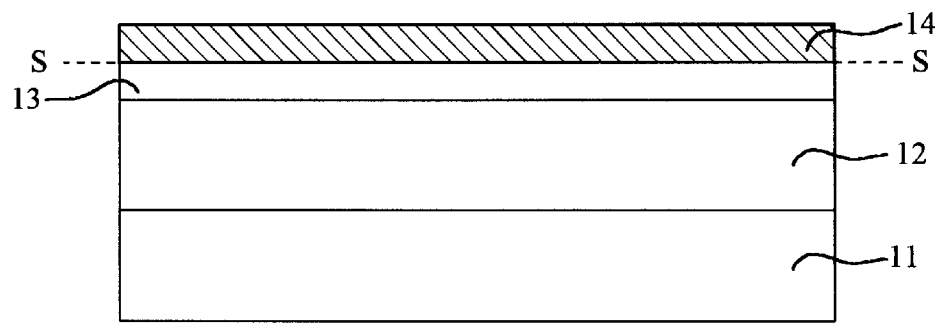

Afterwards, a layer 14 consisting of an electrode material overlaying the top-most layer 13 is formed, as shown in FIG. 1B. Note that if the top-most layer 13 is made of a P-type semiconductor material, the electrode material must be applicable to the P-type most layer 13, i.e., the electrode material is selected from the group consisting of BeAu, ZnAu and the like. On the contrary, if the top-most layer 13 is made of a N-type semiconductor material, the electrode material must be applicable to the N-type top-most layer 13, i.e., the electrode material is selected from the group consisting of GeAu, NiAu, SiAu, and the like.

Figure 1C:
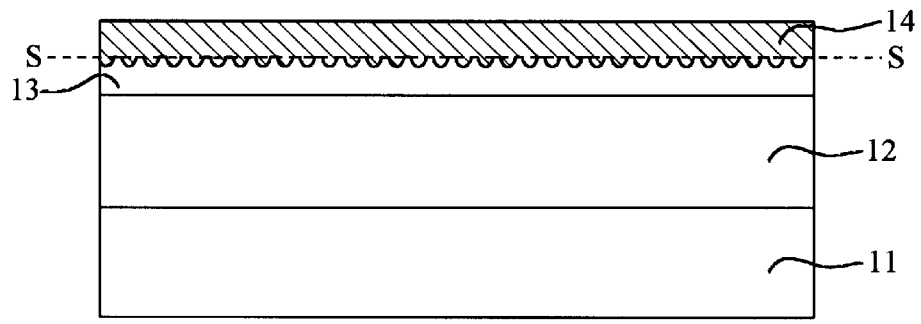

The resultant structure is then performed an annealing process such that the electrode material diffuses through the upper surface S—S into the top-most layer 13, as shown in FIG. 1C.

Figure 1D:
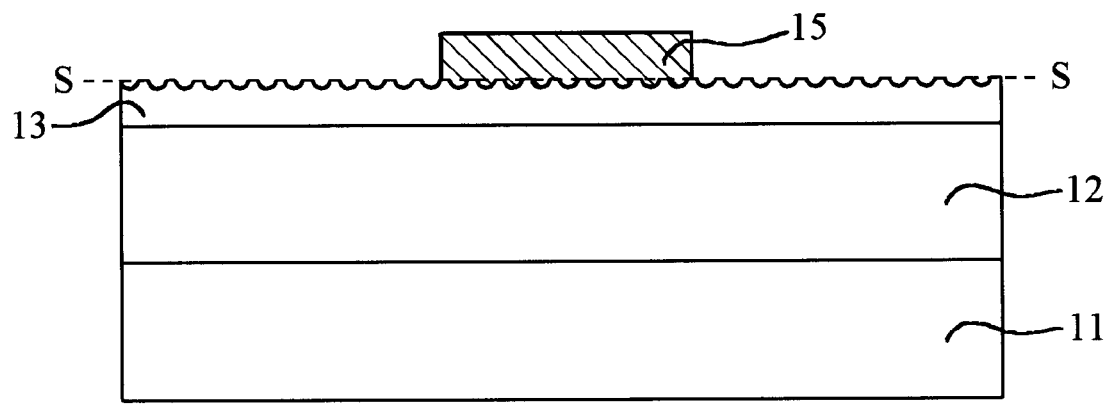

Subsequently, an etch-resistant layer (not shown) covering the layer 14 is formed. Portion of the etch-resistant layer is then selected and removed in accordance with a pattern to partially expose the layer 14. Thereafter, the exposed portion of the layer 14 is etched until the upper surface S—S of the top-most layer 13 beneath the exposed portion of the layer 14 is exposed and roughened. The etch-resistant layer is then removed. As a result, an upper electrode 15 is formed on the top-most layer 13, and the morphology of the roughened surface of the top-most layer 14 exhibits uniformly distributed pits, as shown in FIG. 1D.

Note that during the surface roughing of the top-most layer 13, the top-most layer 13 is substantially attacked by the etching solution in the conventional approach, but the electrode material diffusing into the top-most layer 13 rather than the top-most layer 13 is substantially attacked by the etching solution in the present invention. It is obvious that the surface roughing method according to the invention is mainly by using the annealing process and etching of the electrode material diffusing into the top-most layer. Therefore, the surface roughing method according to the invention is a reproducible and low-cost procedure.

Figure 1E:
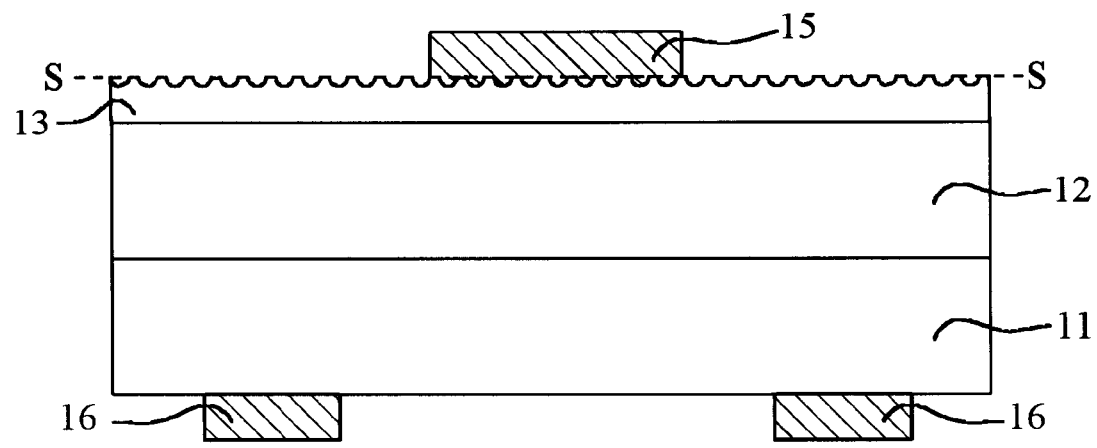

Further, a lower electrode 16 on a lower surface of the semiconductor substrate 11 is formed to achieve the semiconductor light-emitting device, as shown in FIG. 1E.

In practical application, the conditions of the aforesaid annealing process, i.e., isothermal temperature and time, depend on the applied electrode material, and are determined to give sufficient driving force for the diffusion of the electrode material into the top-most layer. Taking a semiconductor light-emitting device having an active layer of AlGaInP as an example, P-type (100)-oriented GaP is used to form the top-most layer of the semiconductor light-emitting device, and the electrode material is used by BeAu. In this case, the top-most layer is performed a surface roughing treatment according to the invention wherein the annealing process is preferably performed at a temperature of between 400° C. and 600° C. for 1 to 30 min. As a result, one preferred morphology of the roughened surface of the top-most layer exhibits uniformly distributed pits of about 0.5 μm in diameter and 0.5 μm in depth.

Referring to TABLE 1, the luminance of the aforesaid case is about 96 mcd.

The luminance of a semiconductor light-emitting device, with the same structure as the aforesaid case but without surface roughing treatment, is about 80 mcd. It is obvious that enhanced proportion of external quantum efficiency of the aforesaid case is about 20%. The luminance of several kinds of semiconductor light-emitting devices with and without surface roughing treatment according to the invention is also listed in TABLE 1. It is obvious that the external quantum efficiencies of all semiconductor light-emitting devices listed in TABLE 1 are enhanced significantly by the surface roughing method according to the invention. On aspect of technology, it is believed that the surface roughing method according to the invention is available for other kinds of semiconductor light-emitting devices not mentioned in the specification of the invention.

TABLE 1

| material of top-most layer/ material of active layer | surface condition | luminance (mcd.) | enhanced proportion (%) |
|---|---|---|---|
| GaP(100)/AlGaInP | not roughened | 80 | 20 |
| | roughened | 96 | |
| GaP(111)/GaP | not roughened | 4 | 200 |
| | roughened | 12 | |
| GaAsP(100)/GaP | not roughened | 10 | 50 |
| | toughened | 15 | |
| AlGaAs(100)/GaAs | not roughened | 15 | 25 |
| | roughened | 19 | |

Figure 2A:
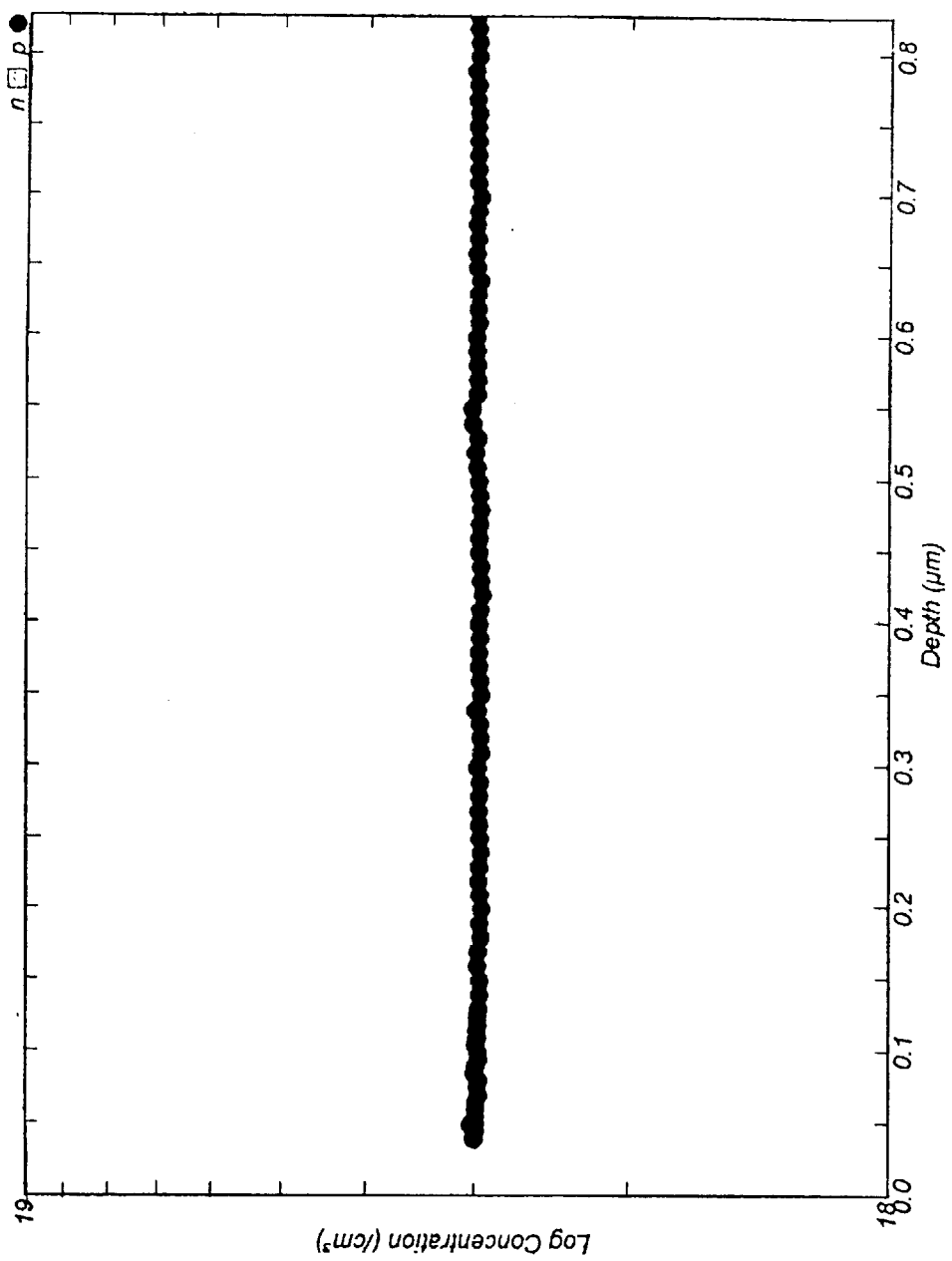
FIG. 2A is a C-V test result of the top-most layer formed of P-type (100)-oriented GaP without surface roughing treatment.
Figure 2B:
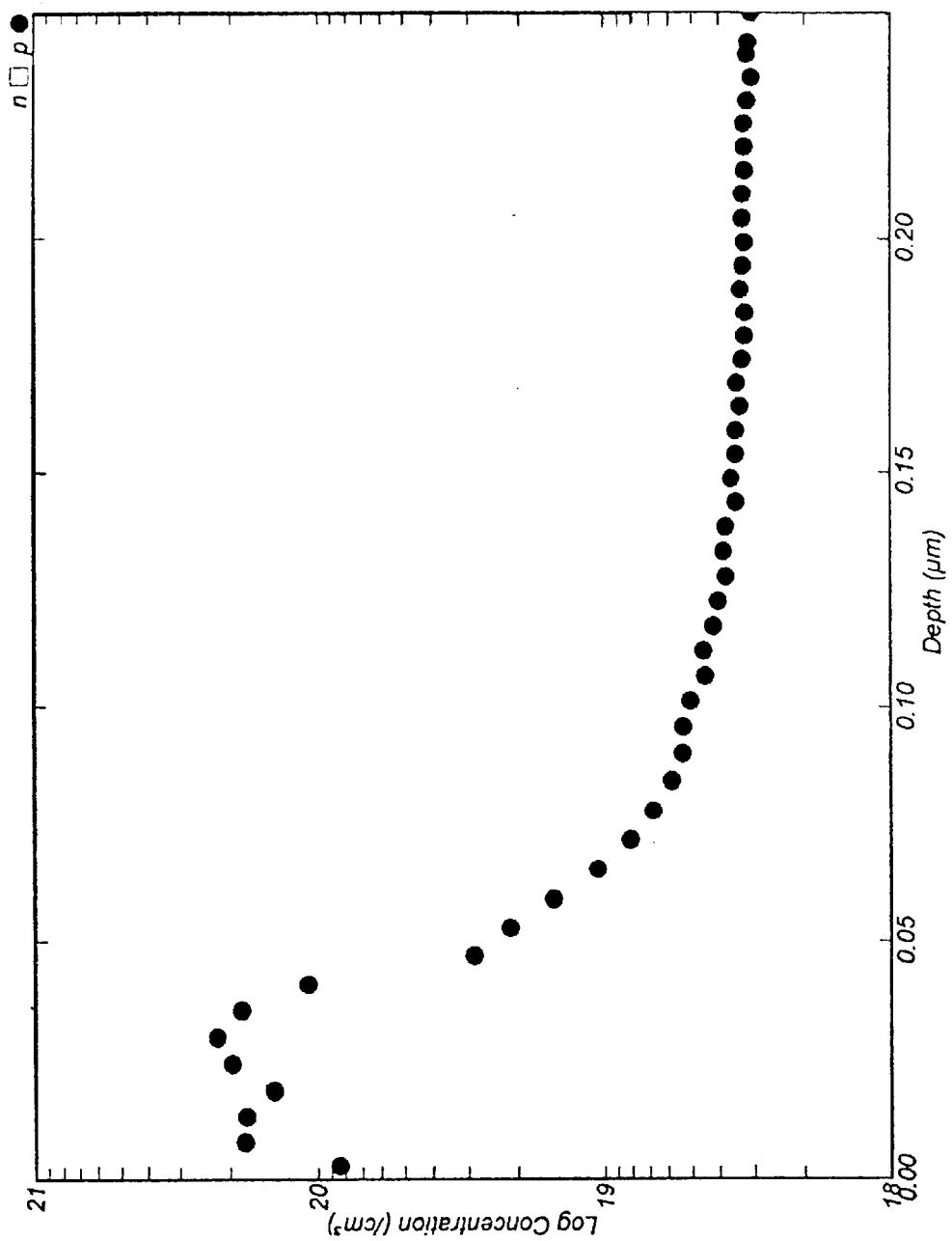
FIG. 2B is a C-V test result of the top-most layer formed of P-type (100)-oriented GaP with surface roughing treatment according to the invention.

In addition, in the invention, the surface charge density of the semiconductor light-emitting device fabricated according to the invention is enhanced significantly by diffusion of the electrode material into the top-most layer. Also taking a semiconductor light-emitting device having an active layer of AlGaInP as an example, a C-V test result of its top-most layer formed of P-type (100)-oriented GaP without surface roughing treatment is shown in FIG. 2A, and a C-V test result of the top-most layer formed of P-type (100)-oriented GaP with surface roughing treatment is shown in FIG. 2B. It is obvious that the surface charge density of the aforesaid case after surface roughing treatment increases about two orders within 0.05 μm in depth. The enhancement of surface charge density may be one reason why the invention can enhance the external quantum efficiency of the semiconductor light-emitting device.

On summary, the distinct features and advantages of the present invention are:

1. The electrode material rather than the top-most layer is etched during the surface rouging of the top-most layer;
2. The surface roughing method is available for any kind of semiconductor light-emitting devices regardless of material and lattice orientation of the top-most layers;
3. The surface of the top-most layer, roughened by the surface roughing method according to the invention, has an uniform surface roughness; and
4. The surface roughing method according to the invention is a reproducible and low-cost procedure.

While the invention has been described in some preferred embodiments, it is understood that the words which have been used are words of description rather than words of limitation and that changes within the purview of the appended claims may be made without departing from the scope and spirit of the invention in its broader aspect.

What is claimed is:

1. A method of fabricating a semiconductor light-emitting device, comprising the steps of:

forming a multi-layer structure on a semiconductor substrate, the multi-layer structure comprising a light-emitting region;

forming a top-most layer overlaying the multi-layer structure;

forming a layer, consisting of an electrode material, overlaying the top-most layer;

performing an annealing process such that the electrode material diffuses into the top-most layer;

etching partially the layer consisting of the electrode material to formed an upper electrode on the top-most layer and to expose part of the top-most layer;

wherein the exposed part of the top-most layer exhibits a rough surface.

2. The method of claim 1, further comprising a step of forming a lower electrode on a lower surface of the semiconductor substrate.

3. The method of claim 1, wherein the morphology of the rough surface shows uniformly distributed pits.

4. The method of claim 1, wherein the light-emitting region comprises a PN-junction.

5. The method of claim 1, wherein the light-emitting region comprises a double hetero-junction.

6. The method of claim 1, wherein the light-emitting region comprises a multiple quantum well.

7. The method of claim 1, wherein the top-most layer is formed of a material selected from the group consisting of GaP, GaAsP and AlGaAs.

8. The method of claim 7, wherein the top-most layer is formed of a P-type material, and the electrode material is selected from the group consisting of BeAu and ZnAu.

9. The method of claim 7, wherein the top-most layer is formed of a N-type material, and the electrode material is selected from the group consisting of GeAu, NiAu and SiAu.

10. A method for roughening an upper surface of a semiconductor combination comprising a light-emitting region, comprising the steps of:

forming an electrode-material layer overlaying said upper surface;

performing an annealing process such that portion of the electrode-material layer diffuses through said upper surface into said semiconductor combination;

forming an etch-resistant layer over the electrode-material layer and removing selected portion of the etch-resistant layer to partially expose the electrode-material layer;

etching the exposed portion of the electrode-material layer and the portion of the electrode-material layer diffusing into said semiconductor combination such that the upper surface beneath the exposed portion of the electrode-material layer is exposed and roughened;

removing the etch-resistant layer.

11. The method of claim 10, wherein the morphology of the exposed part of said upper surface shows uniformly distributed pits.

12. The method of claim 10, wherein the light-emitting region comprises a PN-junction.

13. The method of claim 10, wherein the light-emitting region comprises a double hetero junction.

14. The method of claim 10, wherein the light-emitting region comprises a multiple quantum well.

15. The method of claim 10, wherein the upper surface is provided by a layer formed of a material selected from the group consisting of GaP, GaAsP and AlGaAs.

16. The method of claim 15, wherein the upper surface is provided by a layer formed of a P-type material, and the electrode-material layer is formed of a material selected from the group consisting of BeAu and ZnAu.

17. The method of claim 15, wherein the upper surface is provided by a layer formed of a N-type material, and the electrode-material layer is formed of a material selected from the group consisting of GeAu, NiAu and SiAu.

* * * * *